(12) United States Patent
Craig

(10) Patent No.: US 9,445,515 B2
(45) Date of Patent: Sep. 13, 2016

(54) CIRCUIT BOX

(71) Applicant: Tyco Electronics Corporation, Berwyn, PA (US)

(72) Inventor: Evan Lawrence Craig, Vernon Hills, IL (US)

(73) Assignee: TYCO ELECTRONICS CORPORATION, Berwyn, PA (US)

(*) Notice: Subject to any disclaimer, the term of this patent is extended or adjusted under 35 U.S.C. 154(b) by 126 days.

(21) Appl. No.: 14/185,418

(22) Filed: Feb. 20, 2014

(65) Prior Publication Data
US 2015/0237752 A1 Aug. 20, 2015

(51) Int. Cl.
*H05K 7/02* (2006.01)
*H05K 5/02* (2006.01)

(52) U.S. Cl.
CPC .......... *H05K 5/0247* (2013.01); *H05K 5/0239* (2013.01)

(58) Field of Classification Search
CPC .................................................. H05K 5/0247
USPC ........................................................ 174/541
See application file for complete search history.

(56) References Cited

U.S. PATENT DOCUMENTS

| | | | | |
|---|---|---|---|---|
| 6,545,861 B1* | 4/2003 | Hayes et al. | .................. | 361/642 |
| 6,696,641 B2* | 2/2004 | Sasaoka | ......................... | 174/50 |
| 7,074,053 B2* | 7/2006 | Kawakita et al. | ........... | 439/76.1 |
| 7,105,743 B2* | 9/2006 | Caveney | ......................... | 174/53 |
| 7,928,314 B2* | 4/2011 | Higashikozono et al. | ... | 136/244 |
| 8,866,013 B2* | 10/2014 | Masumoto | ....................... | 174/50 |
| 2006/0180196 A1* | 8/2006 | Lares et al. | .................... | 136/251 |
| 2008/0190477 A1* | 8/2008 | Hattori | .......................... | 136/246 |
| 2009/0260676 A1* | 10/2009 | McMahon et al. | ........... | 136/251 |
| 2010/0039781 A1* | 2/2010 | Tai et al. | ........................ | 361/752 |
| 2011/0108085 A1* | 5/2011 | Quiter | ........................... | 136/244 |
| 2012/0156946 A1* | 6/2012 | Cohen et al. | .................. | 439/754 |
| 2013/0146118 A1* | 6/2013 | Kelley et al. | ................. | 136/244 |

\* cited by examiner

*Primary Examiner* — Hung V Ngo

(57) ABSTRACT

A circuit box includes a housing having an internal compartment. The housing includes first and second entrances for receiving first and second electrical wires, respectively, into the internal compartment. The housing includes first and second wire receptacles that include first and second dielectric shells, respectively, and first and second contacts, respectively, that are held by the first and second dielectric shells, respectively. The first and second contacts are electrically connected together. The first and second dielectric shells include first and second cavities that include pluggable interfaces that are configured to mechanically receive first and second wire terminals, respectively, that terminate the first and second electrical wires, respectively, such that the first and second contacts mechanically mate with the first and second wire terminals, respectively. A circuit element is held within the internal compartment of the housing. The circuit element is electrically connected to the first and second electrical wires.

20 Claims, 8 Drawing Sheets

CIRCUIT BOX

BACKGROUND

The subject matter described and/or illustrated herein relates generally to circuit boxes that provide an electrical circuit between two electrical devices.

Electrical systems commonly consist of one or more electrical devices connected together along an electrical path, each performing a function for the system. For example, separate devices can be included to provide surge protection for the system, and such separate devices may include components such as, but not limited to, fuses, voltage overprotection components, and/or current overprotection components along the electrical path. At least some known electrical surge protection devices are implemented on a printed circuit board (PCB), which may present several disadvantages which may include: the electrical wires that are mounted to the PCB to electrically connect the PCB between the electrical devices may suffer from strain damage where the electrical wires are mounted to the PCB; the PCB may have a limited current carrying capability; electrical isolation provided by a PCB between the various circuit elements and/or between the electrical device and neighboring electrical devices may be limited by conductive tracking on the PCB; the electrical connections between the PCB and the electrical wires and/or components may be inconsistent along the electrical circuit, for example because of human and/or machine error, which may cause the electrical circuit to malfunction and/or fail; and/or PCB's used in known electrical surge protection devices may be susceptible to damage, for example from moisture, dirt, debris, other contaminants, impact, and/or the like.

BRIEF DESCRIPTION

In an embodiment, a circuit box includes a housing having an internal compartment. The housing includes first and second entrances for receiving first and second electrical wires, respectively, into the internal compartment. The housing includes first and second wire receptacles that include first and second dielectric shells, respectively, and first and second contacts, respectively, that are held by the first and second dielectric shells, respectively. The first and second contacts are electrically connected together. The first and second dielectric shells include first and second cavities that include pluggable interfaces that are configured to mechanically receive first and second wire terminals, respectively, that terminate the first and second electrical wires, respectively, such that the first and second contacts mechanically mate with the first and second wire terminals, respectively. A circuit element is held within the internal compartment of the housing. The circuit element is electrically connected to the first and second electrical wires.

In an embodiment, a circuit box includes a housing having an internal compartment. The housing includes first and second entrances for receiving first and second electrical wires, respectively, into the internal compartment. The housing includes first and second wire receptacles that include first and second dielectric shells, respectively, and first and second contacts, respectively, that are held by the first and second dielectric shells, respectively. The first and second contacts are electrically connected together. The first and second dielectric shells include first and second cavities that include pluggable interfaces that are configured to mechanically receive first and second wire terminals, respectively, that terminate the first and second electrical wires, respectively, such that the first and second contacts mechanically mate with the first and second wire terminals, respectively. The housing includes a holder. A circuit element is held within the internal compartment of the housing. The circuit element is electrically connected to the first and second electrical wires. The holder of the housing is engaged in physical contact with the circuit element to hold the circuit element within the internal compartment of the housing.

In an embodiment, a circuit box includes a housing having an internal compartment. The housing includes first and second entrances for receiving first and second electrical wires, respectively, into the internal compartment. The housing includes first and second wire receptacles that include first and second dielectric shells, respectively, and first and second contacts, respectively, that are held by the first and second dielectric shells, respectively. The first and second dielectric shells include first and second cavities that define pluggable interfaces that are configured to mechanically receive first and second wire terminals, respectively, that terminate the first and second electrical wires, respectively, such that the first and second contacts mechanically mate with the first and second wire terminals, respectively. A third electrical wire is held within the internal compartment of the housing. The third electrical wire electrically connects the first wire receptacle to the second wire receptacle. The third electrical wire includes a fuse between the first and second wire receptacles.

DETAILED DESCRIPTION

Figure 1:
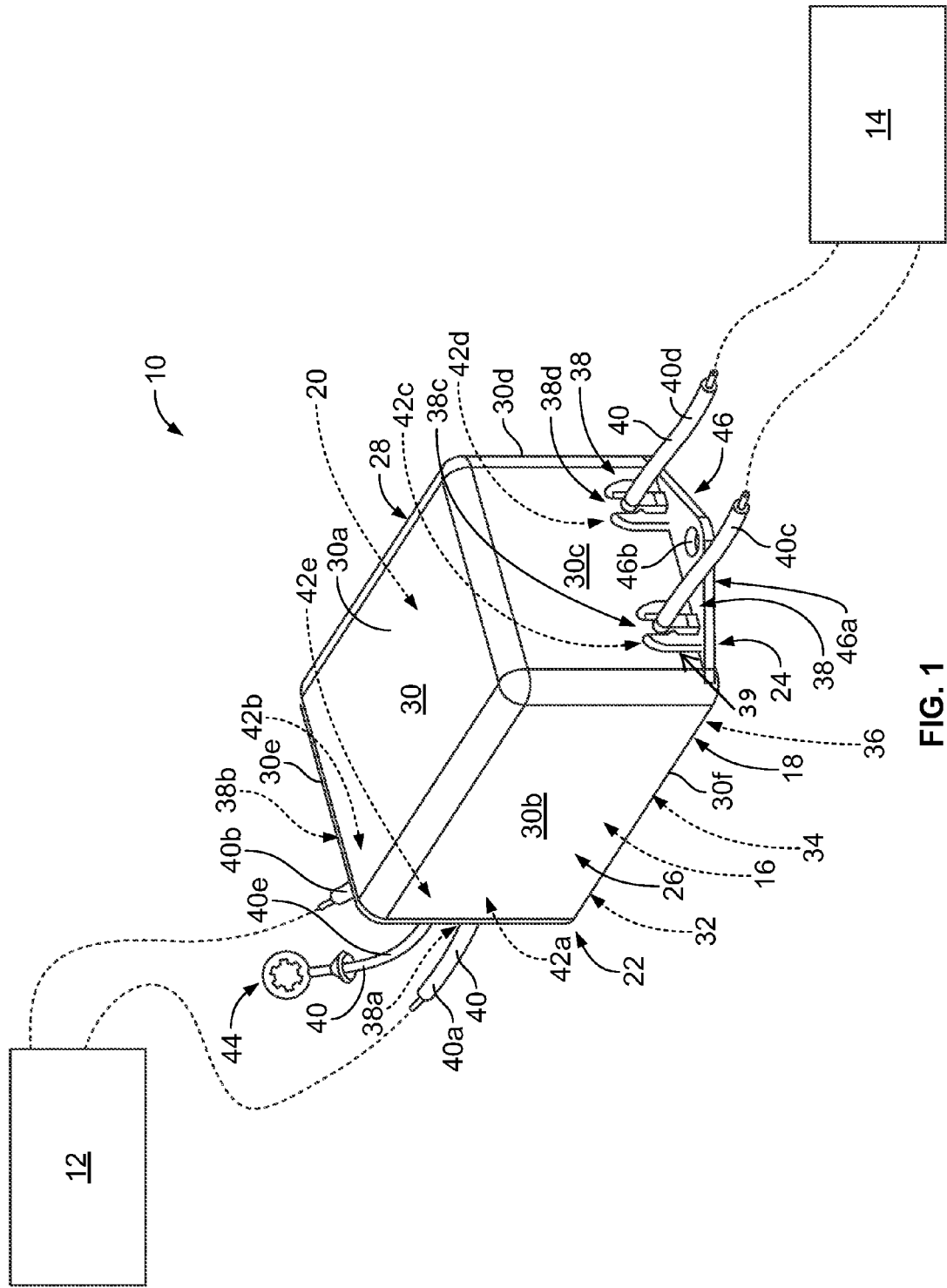
FIG. 1 is a perspective view of an embodiment of a circuit box.

FIG. 1 is a perspective view of an embodiment of a circuit box 10. The circuit box 10 is provided along an electrical path between two electrical devices 12 and 14 for providing an electrical circuit 16 between the electrical devices 12 and 14. The electrical circuit 16 may be any type of electrical circuit, such as, but not limited to, a circuit that provides one or more fuses along the electrical path between the electrical devices 12 and 14, a circuit that provides voltage and/or current overprotection along the electrical path between the electrical devices 12 and 14, and/or the like. Each of the electrical devices 12 and 14 may be any type of electrical device.

The circuit box 10 includes a dielectric housing 18 that holds the various circuit elements of the electrical circuit 16 of the circuit box 10. Specifically, the housing 18 includes an internal compartment 20 within which the various circuit elements of the electrical circuit 16 are contained. The housing 18 extends from an end 22 to an opposite end 24, and extends from an end 26 to an opposite end 28. One or more walls 30 of the housing 18 define and enclose the internal compartment 20. The housing 18 includes an access opening 32 that enables access to the internal compartment 20. Optionally, the housing 18 also includes a cover 34 that is mounted over the access opening 32 to at least partially close the access opening 32. The cover 34 is optionally removably mounted over the access opening 32. The access opening 32 is not visible in FIGS. 1 and 2, but is shown in more detail in FIGS. 3, 5, 7, and 9. The cover 34 is not visible in FIGS. 1 and 2, but is shown in more detail in FIG. 8. Although shown as extending along a bottom side 36 of the housing 18, additionally or alternatively the access opening 32 and the cover 34 may each have any other location along the housing 18. The bottom side 36 is not visible in FIGS. 1 and 2, but is shown in more detail in FIGS. 3, 5, and 7-9.

The housing 18 includes a plurality of entrances 38 for receiving electrical wires 40 into the internal compartment 20. In the illustrated embodiment, the housing 18 includes four entrances 38, specifically entrances 38a, 38b, 38c, and 38d for receiving electrical wires 40a, 40b, 40c, 40d, and 40e, respectively, into the internal compartment 20. The entrances 38a and 38b are not visible in FIG. 1, but are better seen in FIGS. 3, 5, and 7). The electrical wires 40a-40d provide a portion of the electrical path between the electrical devices 12 and 14. Specifically, the electrical wires 40a and 40b are electrically connected to the electrical device 12 (whether directly or indirectly) and include respective ends 42a and 42b that are received into the internal compartment 20 of the housing 18 through the respective entrances 38a and 38b. The electrical wires 40c and 40d are electrically connected to the electrical device 14 (whether directly or indirectly) and include respective ends 42c and 42d that are received into the internal compartment 20 of the housing 18 through the respective entrances 38c and 38d. The electrical wire 40e is a ground connection of the circuit box 10 that includes an end 44 that is configured to be electrically connected to a ground circuit. The electrical wire 40e includes an end 42e. In the illustrated embodiment, the end 42e of the electrical wire 40e is received into the internal compartment 20 of the housing 18 through the entrance 38b. In other words, the electrical wire 40e shares the entrance 38b with the electrical wire 40b in the illustrated embodiment. But, the housing 18 may include another entrance (not shown) for the end 42e of the electrical wire 40e. In other words, the electrical wire 40e may have an entrance independent of any of the electrical wires 40a-40d. Moreover, in some embodiments, two or more of the electrical wires 40a-40e may share an entrance 38. Any number of the electrical wires 40a-40e may share an entrance 38.

The location of each entrance 38a-38e along the housing 18 is meant as exemplary (i.e., as one non-limiting example) only. Each entrance 38a-38e may have any other location along the housing 18 than is shown herein. Although four are described and illustrated herein, the housing 18 may include any number of entrances 38 for receiving any number of electrical wires 40 into the internal compartment. Each of the entrances 38a-38e may be referred to herein as a "first" and/or a "second" entrance. Each of the electrical wires 40a-40e may be referred to herein as a "first" and/or a "second" electrical wire.

Optionally, the housing 18 includes one or more mounting features 46 for mounting the circuit box 10 to another structure (not shown), such as, but not limited to, a support structure, a wall, a panel, a chassis, a frame, a cabinet, and/or the like. In the illustrated embodiment, the mounting features 46 include mounting ears 46a having mounting openings 44b that extend through the mounting ears 46a. The mounting openings 46b are configured to receive threaded and/or other fasteners for holding the housing 18 to the other structure. But, in addition or alternatively to the mounting ears 46a and/or the mounting openings 46b, the housing 18 may include any other type of mounting feature for mounting the housing 18 to the other structure. Although two are shown, the housing 18 may include any number of the mounting features 46. Only one of the mounting features 46 is visible in FIG. 1.

Although shown as having the general shape of a parallelepiped, in addition or alternatively the housing 18 may include any other shape. The housing 18 may include any number of the walls 30. In the illustrated embodiment, the general parallelepiped shape of the housing 18 provides the housing 18 with six walls 30. Specifically, the illustrated embodiment of the housing 18 includes walls 30a, 30b, 30c, 30d, and 30e, with the cover 34 defining at least a portion of the sixth wall 30f of the housing 18.

Figure 3:
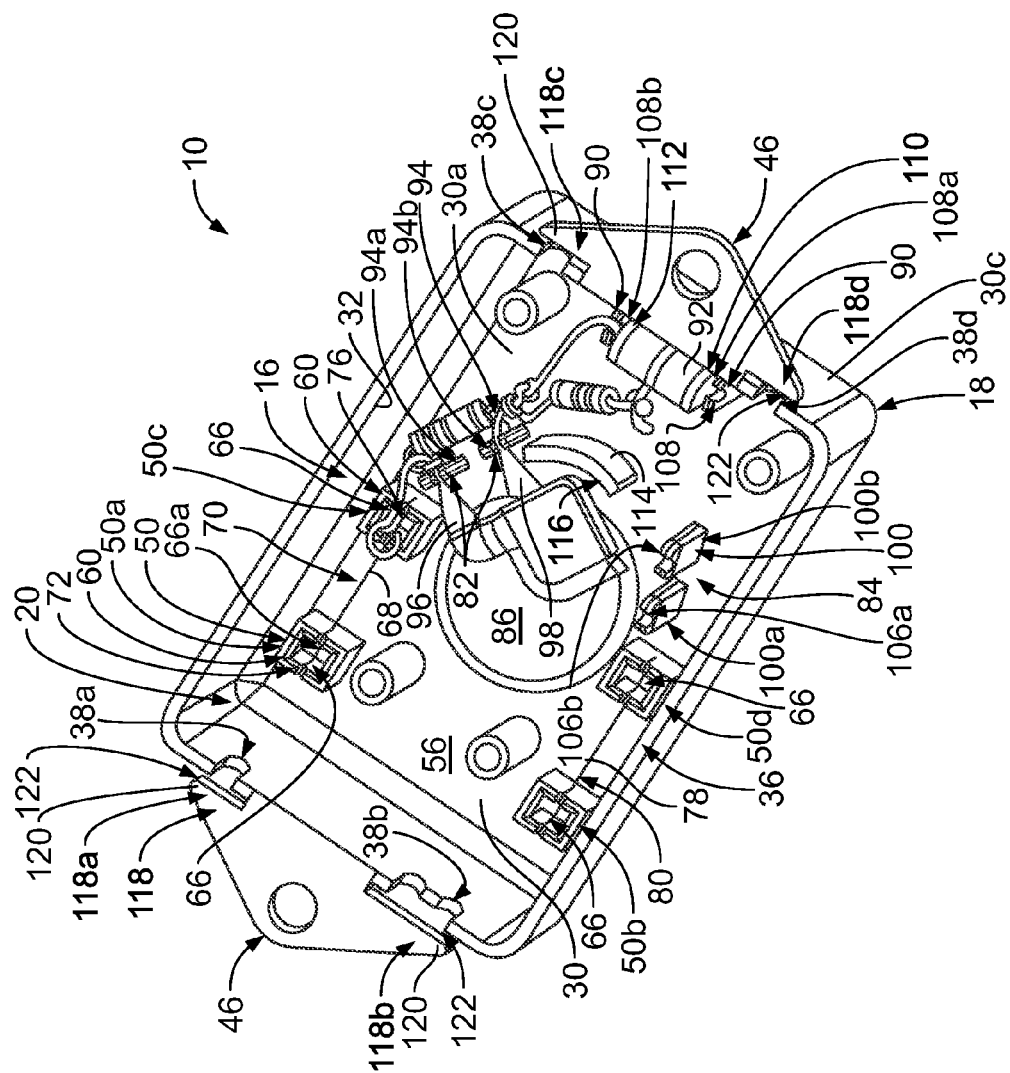
FIG. 3 is a perspective view of a portion of the circuit box shown in FIGS. 1 and 2.

FIG. 3 is a perspective view of a portion of the circuit box 10 illustrating an embodiment of the internal compartment 20 of the housing 18 and an embodiment of a portion of the electrical circuit 16 of the circuit box 10. The circuit box 10 is not limited to the particular electrical circuit 16 shown and described herein. For example, the particular circuit elements (e.g., the electrical wires 70 and 80, the wire receptacles 50, the contacts 66, the varistors 86 and 88, the gas tube 92, the electrical wire 40e, and the resistors 130, 132, 142, and 144 shown in FIG. 5) of the electrical circuit 16 that are described and illustrated herein are meant as non-limiting examples of various circuit elements that may be included as a circuit element of the electrical circuit 16. In addition or alternative to the circuit elements described and/or illustrated herein, the electrical circuit 16 of the circuit box 10 may include any other type of circuit element (s). The electrical circuit 16 of the circuit box 10 also may exclude one or more of the circuit elements that are described and/or illustrated herein as being a circuit element of the electrical circuit 16. Moreover, the electrical circuit 16 of the circuit box 10 is not limited to the particular architecture shown and described herein. For example, the relative arrangement and quantity of the circuit elements of the electrical circuit 16 that are described and illustrated herein is meant as a non-limiting example of an embodiment of the architecture of the electrical circuit 16. The electrical circuit 16 of the circuit box 10 may include any other architecture than is shown and described herein.

As used herein, a "circuit element" includes any electrical component of an electrical circuit, such as, but not limited to, resistors, varistors, diodes, coils, capacitors, inductors, transistors, gas tubes, jumpers, leads, switches, amplifiers, operational amplifiers, fuses, electrical pathways, electrical wires, electrical contacts, and/or the like. Only some of the circuit elements of the electrical circuit 16 are shown in FIG. 3 for clarity.

Figure 2:
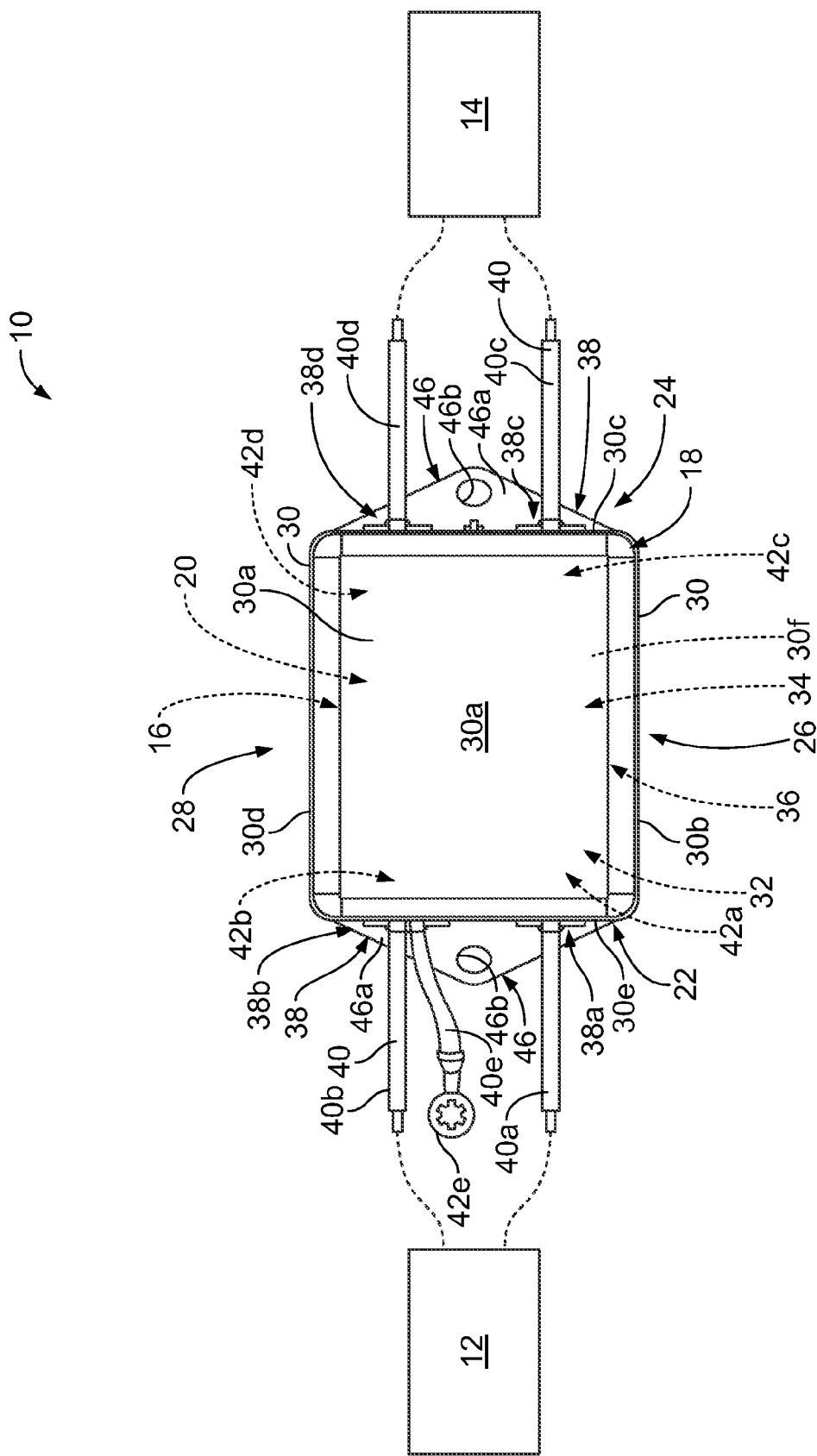
FIG. 2 is a plan view of the circuit box shown in FIG. 1.

The housing 18 includes the entrances 38a, 38b, 38c, and 38d and a plurality of wire receptacles 50. As will be described below, the wire receptacles 50 include pluggable interfaces that receive wire terminals 52 (FIGS. 6 and 7) that terminate the ends 42 (FIGS. 1, 2, 6, and 7) of the electrical wires 40 (FIGS. 1, 2, 6, and 7). In the illustrated embodiment, the housing 18 includes four wire receptacles 50, specifically the wire receptacles 50a, 50b, 50c, and 50d. As will be described below, the wire receptacles 50a, 50b, and 50c receive respective wire terminals 52a, 52e, and 52c (FIG. 7) that terminate the respective ends 42a, 42e, and 42c (FIGS. 1, 2, and 7) of the respective electrical wires 40a, 40e, 40c, and 40d (FIGS. 1, 2, and 7). In some other embodiments, the wire receptacle 50b receives a wire terminal 52b (FIG. 7) that terminates the end 42b (FIGS. 1, 2, and 7) of the electrical wire 40b. Each of the wire receptacles 50a, 50b, 50c, and 50d may be referred to herein as a "first" and/or a "second" wire receptacle. Although four are shown, the housing 18 may include any number of the wire receptacles 50 for receiving the wire terminals 52 of any number of electrical wires 40.

Figure 4:
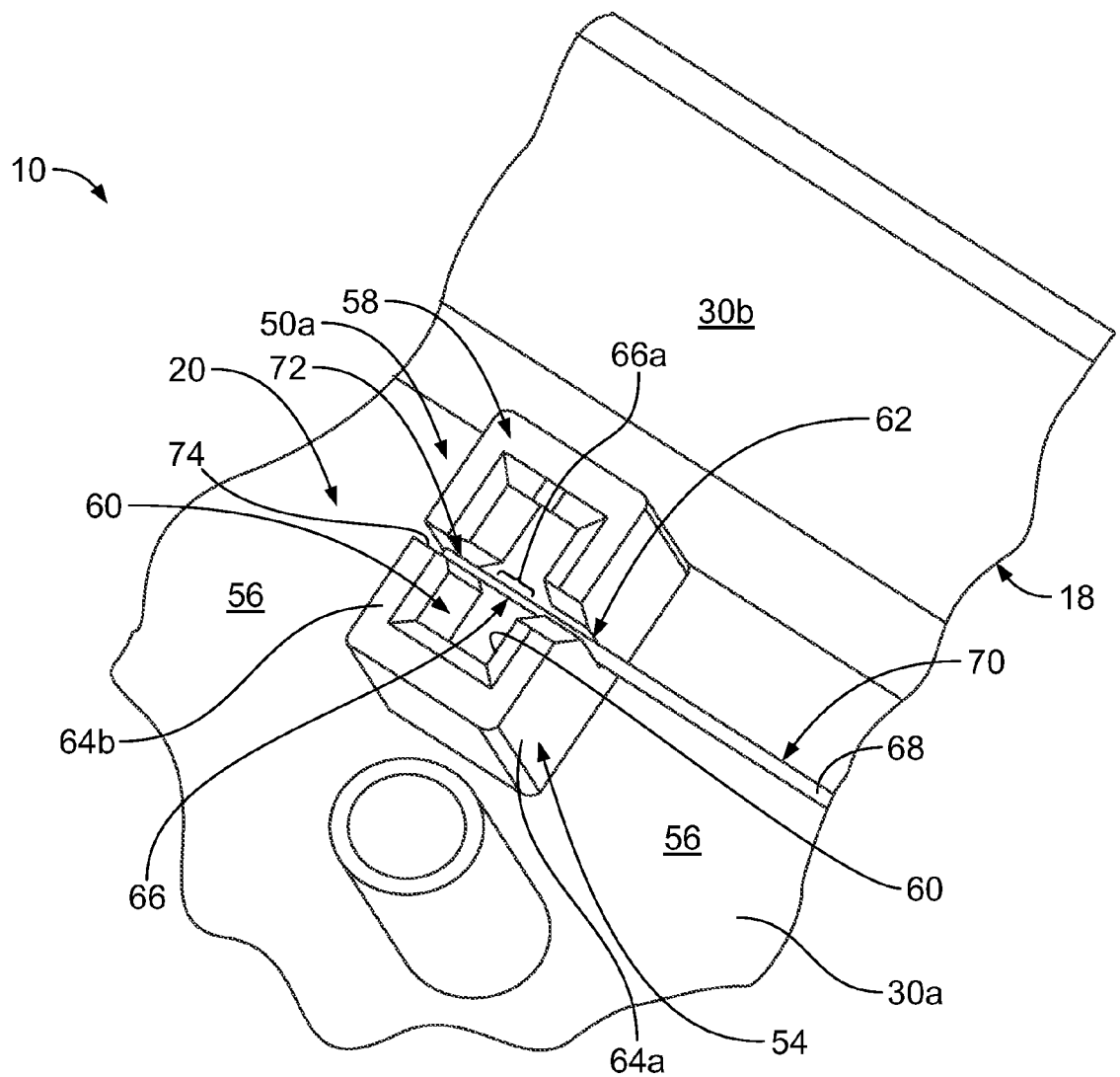
FIG. 4 is an enlarged perspective view of a portion of the circuit box shown in FIGS. 1-3 illustrating an embodiment of a wire receptacle of the circuit box.

FIG. 4 is an enlarged perspective view of a portion of the circuit box 10 illustrating an embodiment of the wire receptacle 50a. The wire receptacles 50b, 50c, and 50d (FIGS. 3, 5, and 7) are substantially similar to the wire receptacle 50a and therefore will not be described in as great detail herein as the wire receptacle 50a. The wire receptacle 50a includes a dielectric shell 54 that extends from the wall 30a of the housing 18. Specifically, the shell 54 extends outward from an interior surface 56 of the wall 30a that defines a boundary of the internal compartment 20 of the housing 18. The shell 54 extends outward from the interior surface 56 of the wall 30a to an end 58 of the shell 54. The shell 54 may be referred to herein as a "first" and/or a "second" dielectric shell 54.

The shell 54 includes a cavity 60 that extends into the end 58 of the shell 54 generally toward the wall 30a. As will be described below, the cavity 60 is configured to pluggably receive the wire terminal 52a (FIGS. 6 and 7) of the electrical wire 40a (FIGS. 1, 2, 6, and 7) therein. The cavity 60 may include any size and any shape that enables the cavity 60 to receive the wire terminal 52a therein. The shell 54 includes an optional opening 62 that extends through a sidewall 64a of the shell 54 such that the opening 62 communicates with the cavity 60. The cavity 60 may be referred to herein as a "first" and/or a "second" cavity.

Optionally, the shell 54 is integrally formed as a single, unitary body with one or more walls 30 of the housing 18. In the illustrated embodiment, the shell 54 is integrally formed with the wall 30a of the housing 18 as a single, unitary body. The shell 54 may be fabricated from the same dielectric material(s) as the housing 18, or may be fabricated from one or more different dielectric materials than the housing 18 (whether or not the shell 54 and housing 18 include any common dielectric material(s).

The wire receptacle 50a holds a contact 66 that is held by the shell 54 within the cavity 60. The contact 66 is configured to mechanically mate with the wire terminal 52a when the wire terminal 52a is inserted into the cavity 60. In the illustrated embodiment, the contact 66 is a segment 66a of an electrical conductor 68 of an electrical wire 70. The electrical wire 70 electrically connects the wire receptacle 50a to the wire receptacle 50c. The opening 62 of the shell 54 enables the electrical conductor 68 of the electrical wire 70 to extend into the cavity 60 through the sidewall 64 of the shell 54. The contact 66 is not limited to being a segment of the electrical conductor 68 of the electrical wire 70. Rather, the contact 66 may have any other structure, such as, but not limited to, a discrete electrical contact (not shown) that terminates the electrical conductor 68 (or terminates another conductive element in embodiments [e.g., see below] wherein another electrically conductive structure is used to electrically connect the wire receptacle 50a to the wire receptacle 50c). Optionally, an end 72 of the electrical conductor 70 is shown as extending into an optional opening 74 that extends through a sidewall 64b that is opposite the sidewall 64a. The segment 66a of the electrical conductor 70 may or may not include the end 72. The segment 66a of the electrical conductor 68 may be referred to herein as a "first" and/or a "second" segment. The contact 66 of the wire receptacle 50a may be referred to herein as a "first" and/or a "second" contact. The electrical wire 70 may be referred to herein as a "third" and/or "another" electrical wire.

The contact 66 of the wire receptacle 50a may have any structure that enables the contact 66 to mechanically mate with the wire terminal 52a. Optionally, the contact 66 is configured to separably mate with the wire terminal 52a. In the illustrated embodiment, the contact 66 has a structure that is configured to mechanically mate with an insulation displacement (ID) type contact. The electrical wire 70 may or may not include an electrical insulation layer (not shown) that surrounds the electrical conductor 68 and is displaced by the wire terminal 52a when the wire terminal 52a mechanically mates with the contact 66.

Referring again to FIG. 3, as described above, the electrical wire 70 electrically connects the wire receptacle 50a to the wire receptacle 50c. Specifically, FIG. 3 illustrates that the electrical conductor 68 of the electrical wire 70 extends a length from the end 72 to an opposite end 76. The segment 66a (better seen in FIG. 4) of the electrical conductor 68 extends within the cavity 60 of the wire receptacle 50a to comprise the contact 66 (better seen in FIG. 4) of the wire receptacle 50a. The length of the electrical conductor 68 extends from the wire receptacle 50a to the wire receptacle 50c such that a segment 66c of the electrical conductor 68 extends within a cavity 60 of the wire receptacle 50c to comprise the contact 66 of the wire receptacle 50c. The electrical conductor 68 of the electrical wire 70 thereby electrically connects the contact 66 of the wire receptacle 50a with the contact 66 of the wire receptacle 50c. Optionally, the electrical wire 70 comprises a fuse between the wire receptacles 50a and 50c. For example, a segment of the length of the electrical conductor 68 may be configured to function as a sacrificial device that provides overcurrent protection between the wire receptacles 50a and 50c. The segment 66c of the electrical conductor 68 may be referred to herein as a "first" and/or a "second" segment. The contact 66 of the wire receptacle 50c may be referred to herein as a "first" and/or a "second" contact.

The wire receptacles 50b and 50d are electrically connected together. The wire receptacles 50b and 50d may be electrically connected together in a substantially similar manner to the wire receptacles 50a and 50c. Specifically, in the illustrated embodiment, a contact 66 of the wire receptacle 50b is electrically connected to a contact 66 of the wire receptacle 50d via an electrical conductor 78 of an electrical wire 80. Optionally, the electrical wire 80 comprises a fuse between the wire receptacles 50b and 50d. For example, a segment of the length of the electrical conductor 78 may be configured to function as a sacrificial device that provides overcurrent protection between the wire receptacles 50b and 50d. The contacts 66 of the wire receptacles 50b and 50d each may be referred to herein as a "first" and/or a "second" contact.

The electrical circuit 16 of the circuit box 10 is not limited to using the electrical wire 70 to electrically interconnect the wire receptacles 50a and 50c and is not limited to using the electrical wire 80 to electrically interconnect the wire receptacles 50b and 50d. Rather, the electrical circuit 16 may include any other type of electrically conductive structure for electrically interconnecting the wire receptacles 50a and 50c and for electrically interconnecting the wire receptacles 50*b* and 50*d*, such as, but not limited to, foil, strip, sheet, embedded, plated, printed, or cast metal.

The housing 18 of the circuit box 10 optionally includes one or more holders for holding various circuit elements of the electrical circuit 16 within the internal compartment 20 of the housing 18. For example, in the illustrated embodiment, the housing 18 includes holders 82 and 84 that engage in physical contact with respective varistor 86 and 88 of the electrical circuit 16 to hold the respective varistor 86 and 88 within the internal compartment 20. The varistor 88 is not included within FIG. 3 for clarity, but can be seen in FIGS. 5 and 7. The illustrated embodiment of the housing 18 also includes a holder 90 that engages in physical contact with a gas tube 92 of the electrical circuit 16 to hold the gas tube 92 within the internal compartment 20. Although three holders 82, 84, and 90 are shown, the housing 18 may include any number of holders 82, 84, and 90 overall, and may include any number of each of the holders 82, 84, and 90.

The holder 82 includes two sub-holders 94, specifically a sub-holder 94*a* and a sub-holder 94*b*. The sub-holders 94*a* and 94*b* are configured to engage in physical contact with respective leads 96 and 98 of the varistor 86. But, the sub-holders 94*a* and 94*b* are not limited to engaging in physical contact with the leads 96 and 98, respectively, to hold the varistor 86 within the internal compartment 20 of the housing 18. Rather, in addition or alternatively to the respective leads 96 and 98, each sub-holder 94*a* and 94*b* may engage in physical contact with the varistor 86 at any other location along the varistor 86 to hold the varistor 86 within the internal compartment 20.

In the illustrated embodiment, the sub-holders 94*a* and 94*b* of the holder 82 engage in physical contact with the respective leads 96 and 98 with a snap-fit connection. But, the sub-holders 94*a* and 94*b* are not limited to the snap-fit connection of the illustrated embodiment. Rather, each of the sub-holders 94*a* and 94*b* may engage in physical contact with the respective lead 96 and 98 using any other type of connection, such as, but not limited to, an interference-fit connection, using a fastener, using an adhesive, and/or the like. Although two are shown, the holder 82 may include any number of the sub-holders 94.

Optionally, the holder 82 is integrally formed as a single, unitary body with one or more walls 30 of the housing 18. For example, one or both of the sub-holders 94*a* and 94*b* may be integrally formed as a single, unitary body with one or more walls 30 of the housing 18 (whether or not the sub-holders 94*a* and 94*b* are integrally formed as a single, unitary body with the same wall 30). In the illustrated embodiment, the sub-holders 94*a* and 94*b* are each integrally formed with the wall 30*a* of the housing 18 as a single, unitary body. The holder 82 may be fabricated from the same dielectric material(s) as the housing 18, or may be fabricated from one or more different dielectric materials than the housing 18 (whether or not the holder 82 and housing 18 include any common dielectric material(s).

The holder 84 includes two sub-holders 100, specifically a sub-holder 100*a* and a sub-holder 100*b*. The sub-holders 100*a* and 100*b* are configured to engage in physical contact with respective leads 102 and 104 (FIGS. 5 and 7) of the varistor 88, however the sub-holders 100*a* and 100*b* are not limited to engaging in physical contact with the leads 102 and 104, respectively, to hold the varistor 88 within the internal compartment 20 of the housing 18. Rather, in addition or alternatively to the respective leads 102 and 104, each sub-holder 100*a* and 100*b* may engage in physical contact with the varistor 88 at any other location along the varistor 88 to hold the varistor 88 within the internal compartment 20.

In the illustrated embodiment, the sub-holders 100*a* and 100*b* of the holder 84 engage in physical contact with the respective leads 102 and 104 with a snap-fit connection. Specifically, the sub-holders 100*a* and 100*b* include respective snap-fit members 106*a* and 106*b* that receive the leads 102 and 104, respectively, with a snap-fit connection. But, the sub-holders 100*a* and 100*b* are not limited to the snap-fit connection of the illustrated embodiment. Rather, each of the sub-holders 100*a* and 100*b* may engage in physical contact with the respective lead 102 and 104 using any other type of connection, such as, but not limited to, an interference-fit connection, using a fastener, using an adhesive, and/or the like. Although two are shown, the holder 84 may include any number of the sub-holders 100.

Optionally, the holder 84 is integrally formed as a single, unitary body with one or more walls 30 of the housing 18. For example, one or both of the sub-holders 100*a* and 100*b* may be integrally formed as a single, unitary body with one or more walls 30 of the housing 18 (whether or not the sub-holders 100*a* and 100*b* are integrally formed as a single, unitary body with the same wall 30). In the illustrated embodiment, the sub-holders 100*a* and 100*b* are each integrally formed with the wall 30*a* of the housing 18 as a single, unitary body. The holder 84 may be fabricated from the same dielectric material(s) as the housing 18, or may be fabricated from one or more different dielectric materials than the housing 18 (whether or not the holder 84 and housing 18 include any common dielectric material(s).

The holder 90 includes two sub-holders 108, specifically a sub-holder 108*a* and a sub-holder 108*b*. The sub-holders 108*a* and 108*b* are configured to engage in physical contact with respective ends 110 and 112 of the gas tube 92. But, the sub-holders 108*a* and 108*b* are not limited to engaging in physical contact with the ends 110 and 112, respectively, to hold the gas tube 92 within the internal compartment 20 of the housing 18. Rather, in addition or alternatively to the respective ends 110 and 112, each sub-holder 108*a* and 108*b* may engage in physical contact with the gas tube 92 at any other location along the gas tube 92 to hold the gas tube 92 within the internal compartment 20.

In the illustrated embodiment, the sub-holders 108*a* and 108*b* of the holder 90 engage in physical contact with the respective ends 110 and 112 with a snap-fit connection. But, the sub-holders 108*a* and 108*b* are not limited to the snap-fit connection of the illustrated embodiment. Rather, each of the sub-holders 108*a* and 108*b* may engage in physical contact with the respective ends 110 and 112 using any other type of connection, such as, but not limited to, an interference-fit connection, using a fastener, using an adhesive, and/or the like. Although two are shown, the holder 90 may include any number of the sub-holders 108.

Optionally, the holder 90 is integrally formed as a single, unitary body with one or more walls 30 of the housing 18. For example, one or both of the sub-holders 108*a* and 108*b* may be integrally formed as a single, unitary body with one or more walls 30 of the housing 18 (whether or not the sub-holders 108*a* and 108*b* are integrally formed as a single, unitary body with the same wall 30). In the illustrated embodiment, the sub-holders 108*a* and 108*b* are each integrally formed with the wall 30*a* of the housing 18 as a single, unitary body. A non-limiting example of another wall 30 of the housing 18 that the holder 90 may be integrally formed with as a single, unitary body is the wall 30*c*. The holder 90 may be fabricated from the same dielectric material(s) as the housing 18, or may be fabricated from one or more different dielectric materials than the housing 18 (whether or not the holder 90 and housing 18 include any common dielectric material(s).

The housing 18 includes an optional support member 114 that extends outward from the interior surface 56 of the wall 30a. The support member 114 includes an end 116 that is configured to engage in physical contact with the varistor 88 to support the varistor 88 within the internal compartment 20 of the housing 18. Although only one is shown, the housing 18 may include any number of the support members 114, each of which may have any location along the housing 18 for supporting any circuit elements of the electrical circuit 16.

The support member 114 is optionally integrally formed as a single, unitary body with one or more walls 30 of the housing 18. In the illustrated embodiment, the support member 114 is integrally formed with the wall 30a of the housing 18 as a single, unitary body. The support member 114 may be fabricated from the same dielectric material(s) as the housing 18, or may be fabricated from one or more different dielectric materials than the housing 18 (whether or not the support member 114 and housing 18 include any common dielectric material(s).

The housing 18 optionally includes one or more strain relief members 118 for providing strain relief to the electrical wires 40a, 40b, 40c, 40d, and/or 40e (FIGS. 1, 2, and 7). In the illustrated embodiment, the housing 18 includes four strain relief members, specifically strain relief members 118a, 118b, 118c, and 118d. The strain relief members 118a, 118b, 118c, and 118d provide strain relief to the electrical wires 40a, 40b, 40c, and 40d, respectively. The strain relief member 118b also provides strain relief to the electrical wire 40e in the illustrated embodiment. The illustrated embodiment of each strain relief member 118 includes a tab 120, and entrance clamp 39 (shown in FIG. 1; which is a component of the cover 34 that is optionally integrally formed with another portion [e.g., a remainder] of the cover 34 as a single, unitary body), and a slot 122. The slot 122 receives the corresponding electrical wire 40 therethrough. The entrance clamp 39 snaps past the tab 120 and thereby provides strain relief to the electrical wire 40. But, in addition or alternatively to the tab 120, entrance clamp 39, and/or the slot 122, each strain relief member 118 may have any other structure that enables the strain relief member 118 to provide strain relief to the corresponding electrical wire 40. Although shown as being comprises by a portion of the mounting features 46, one or more of the strain relief members 118 may be discrete from the mounting features 46.

Figure 5:
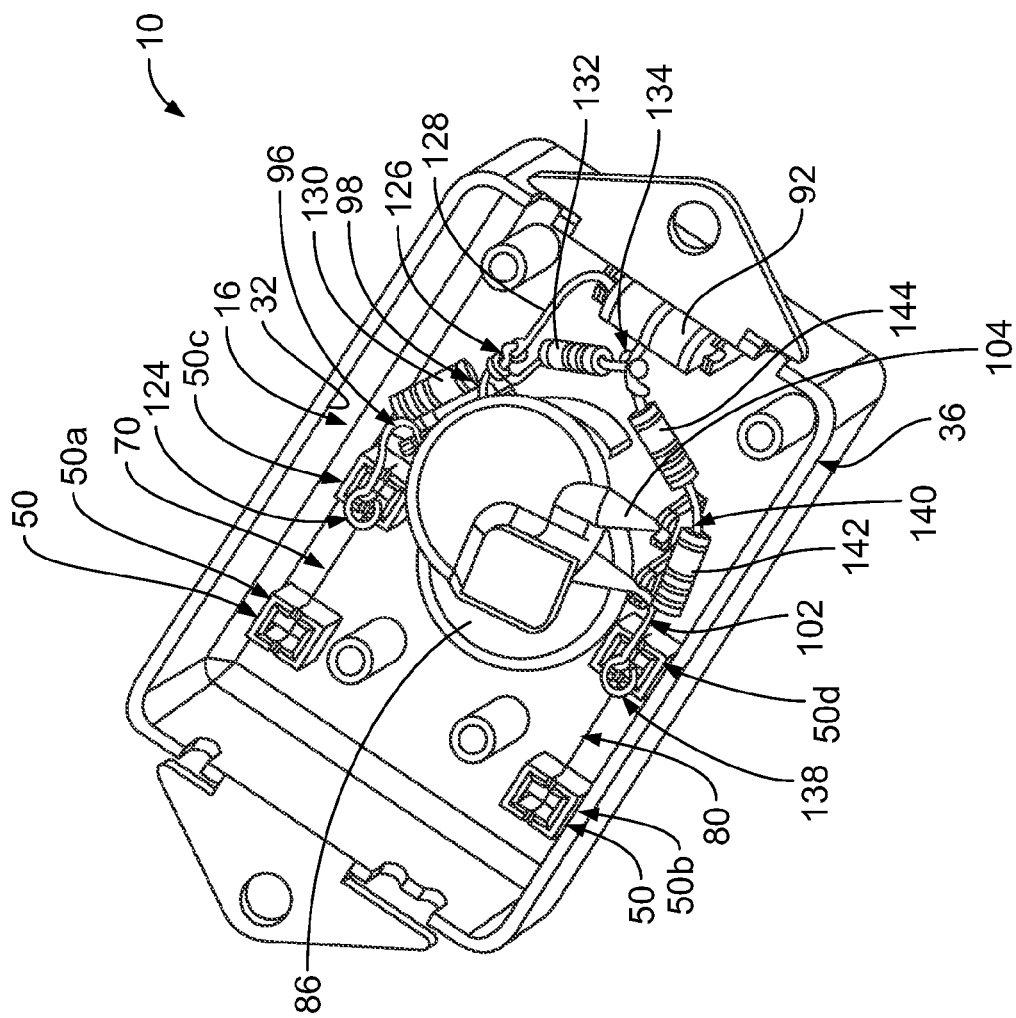
FIG. 5 is another perspective view of a portion of the circuit box shown in FIGS. 1-4.

FIG. 5 is a perspective view of a portion of the circuit box 10 illustrating an embodiment of the electrical circuit 16 of the circuit box 10. As described above, the circuit box 10 is not limited to the particular electrical circuit 16 shown and described herein. Rather, the particular circuit elements and the particular architecture of the electrical circuit 16 described and/or illustrated herein are meant as non-limiting examples of the various circuit elements and architecture that may be included within the electrical circuit 16.

In the illustrated embodiment, the various circuit elements of the electrical circuit 16 include the electrical wires 70 and 80, the wire receptacles 50, the contacts 66, the varistors 86 and 88, the gas tube 92, and the electrical wire 40e (FIGS. 1, 2, and 7). The varistor 86 includes the leads 96 and 98. The lead 96 includes an end 124 that is, in the illustrated embodiment, configured to be electrically connected to the electrical wire 40c (FIGS. 1, 2, and 7) and the wire receptacle 50c. The lead 98 of the varistor 86 includes an end 126 that is, in the illustrated embodiment, configured to be electrically connected to a lead 128 of the gas tube 92. Optionally, a resistor 130 is electrically connected between the leads 96 and 98. In the illustrated embodiment, the end 126 of the lead 98 is also electrically connected to a resistor 132 that includes a lead 134 that is configured to electrically connect to the end 42b (FIGS. 1, 2, and 7) of the electrical wire 40b (FIGS. 1, 2, and 7). The lead 134 is also configured to be electrically connected to a lead 136 (FIG. 7) of the electrical wire 40d (FIGS. 1, 2, and 7) in the illustrated embodiment.

The varistor 88 includes the leads 102 and 104. The lead 102 includes an end 138 that is configured to be electrically connected to the wire receptacle 50d in the illustrated embodiment. The lead 104 includes an end 140 that is electrically connected to an optional resistor 142. Moreover, in the illustrated embodiment, a resistor 144 is electrically connected between the lead 134 of the resistor 132 and the end 140 of the lead 104. Each of the varistors 86 and 88 may be any type of varistor, such as, but not limited to, a metal oxide resistor and/or the like. Each resistor 130, 132, 142, and 144 may be any type of resistor having any electrical resistance value. The gas tube 92 may be any type of gas tube.

Figure 6:
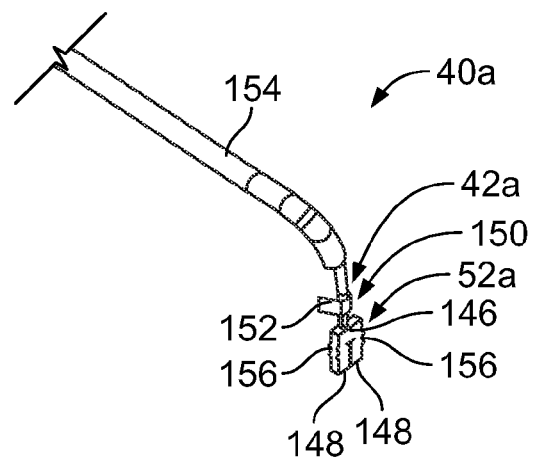
FIG. 6 is a perspective view of an embodiment of an electrical wire for use with the circuit box shown in FIGS. 1-5.
Figure 7:
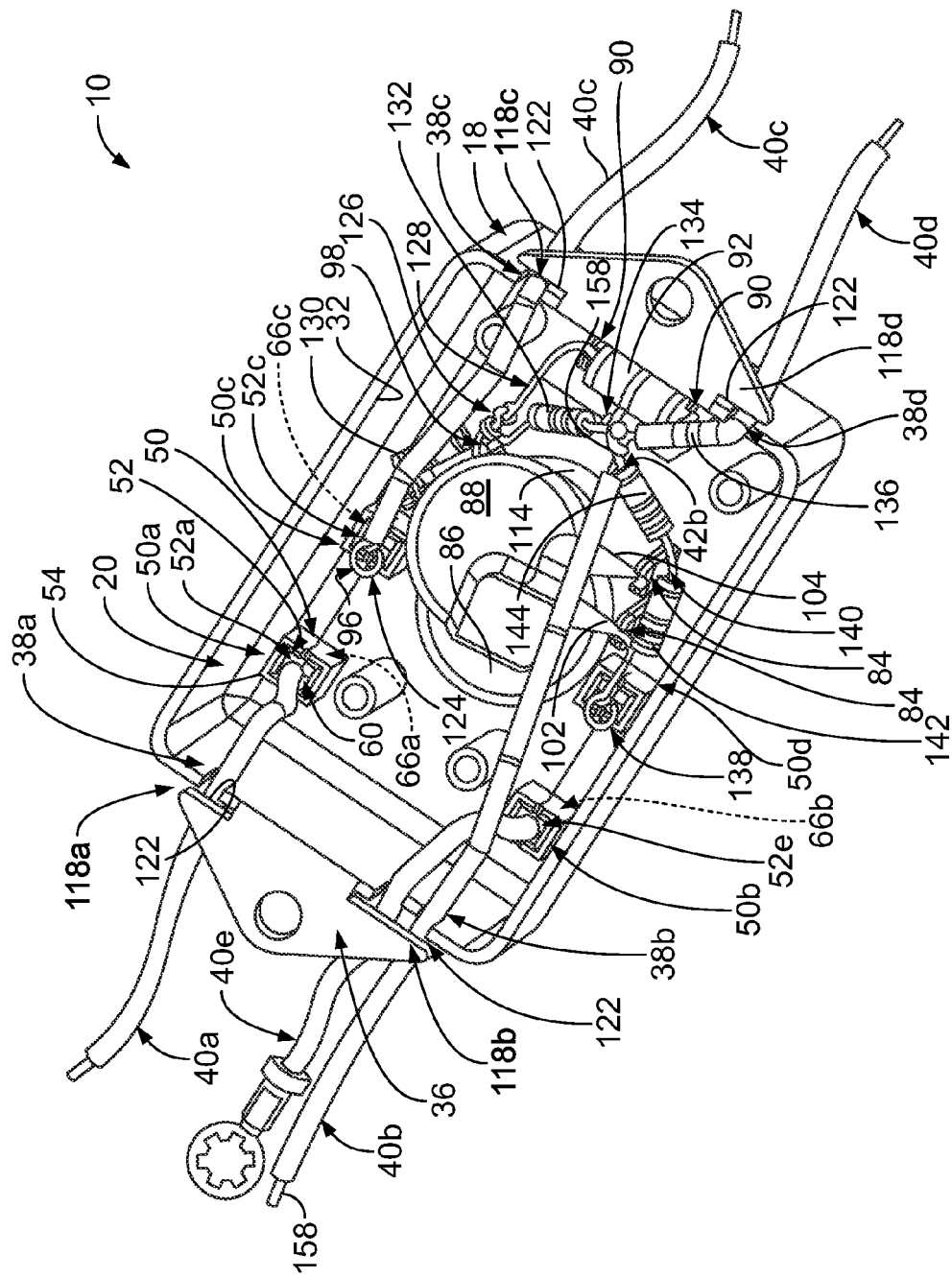
FIG. 7 is another perspective view of a portion of the circuit box shown in FIGS. 1-5.

FIG. 6 is a perspective view of the electrical wire 40a illustrating an embodiment of the wire terminal 52a. The wire terminals 52e, 52c, and 52d (FIG. 7) are substantially similar to the wire terminal 52a and therefore will not be described in as great of detail herein as the wire terminal 52a. Each of the wire terminals 52a, 52e, 52c, and 52d may be referred to herein as a "first" and/or a "second" wire terminal.

As described above, the wire terminal 52a terminates the end 42a of the electrical wire 40a. In the illustrated embodiment, the wire terminal 52a is an ID type contact. Specifically, the illustrated embodiment of the wire terminal 52a includes a base 146 and two prongs 148 that extend from the base 146. The wire terminal 52a is configured to mechanically mate with the contact 66a (FIGS. 3, 4, and 7) of the wire receptacle 50a by receiving the contact 66a between the prongs 148. Optionally, the wire terminal 52a is configured to separably mate with the contact 66a. As described above, the contact 66a may or may not include an electrical insulation layer (not shown) that is displaced by the prongs 148 as the contact 66a is received between the prongs 148. The wire terminal 52a is not limited to being an ID type contact. Rather, in addition or alternatively, the wire terminal 52a may have any structure that enables the wire terminal 52a to mechanically mate with the contact 66a.

Optionally, the wire terminal 52a includes a strain relief member 150 for providing strain relief to the electrical wires 40a. The strain relief member 150 may have any structure that provides strain relief to the electrical wire 40a. In the illustrated embodiment, the strain relief member 150 includes a pair of arms 152. The arms 152 are configured to be wrapped (e.g., crimped) around an insulation layer 154 of the electrical wire 40a to support the electrical wire 40a and thereby provide strain relief to the electrical wire 40a. The insulation layer 154 of electrical wire 40a is shown stripped back from the arms 152 in FIG. 6 for clarity. Although two arms 152 are shown and described herein, the strain relief member 150 may include any number of the arms 152.

The wire terminal 52a optionally includes one or more barbs 156 that extend outwardly on the prongs 148. When the wire terminal 52a is pluggably received within the wire receptacle 50a, each barb 156 is configured to engage the shell 54 (FIGS. 4 and 7) of the wire receptacle 50*a* with an interference fit to provide strain relief to the electrical wire 40*a*. Each prong 148 may include any number of barbs 156.

FIG. 7 is a perspective view of a portion of the circuit box 10 illustrating the electrical wires 40*a*-40*e* as connected to the circuit box 10. As can be seen in FIG. 7, the electrical wires 40*a*, 40*b*, 40*c*, 40*d*, have been received into the internal compartment 20 of the housing 18 through the respective entrances 38*a*, 38*b*, 38*c*, and 38*d* of the housing 18. The electrical wire 40*e* has been received into the internal compartment 20 through the entrance 38*b* in the illustrated embodiment. Each of the electrical wires 40*a*, 40*b*, 40*c*, and 40*d* is received through the slot 122 of the respective strain relief member 118*a*, 118*b*, 118*c*, and 118*d* such that the strain relief members 118*a*, 118*b*, 118*c*, and 118*d* provide strain relief to the electrical wires 40*a*, 40*b*, 40*c*, and 40*d*, respectively. In the illustrated embodiment, the electrical wire 40*e* is received through the slot 122 of the strain relief member 118*b* to provide strain relief to the electrical wire 40*e*.

The wire terminals 52 of the electrical wires 40 are pluggably received into the wire receptacles 50 of the housing 18. Specifically, the wire terminals 52*a*, 52*e*, and 52*c* of the electrical wires 40*a*, 40*e*, and 40*c* are pluggably received into the cavity 60 of the respective wire receptacle 50*a*, 50*b*, and 50*c* such that each wire terminal 52*a*, 52*e*, and 52*c* is mechanically mated with the respective contact 66*a*, 66*b*, and 66*c* of the respective wire receptacle 50*a*, 50*b*, and 50*c*. The electrical wires 40*a*, 40*e*, and 40*c* are thereby electrically connected to the respective contacts 66*a*, 66*b*, and 66*c* of the respective wire receptacles 50*a*, 50*b*, and 50*c*. The mechanical connection between the wire terminals 52 and the contacts 66 enables the electrical wires 40 to be electrically connected to the wire receptacles 50 without using solder. As described above, the barbs 156 (FIG. 6) of the wire terminals 52 engage the shell 54 of the corresponding wire receptacle 50 with an interference fit to provide strain relief to the corresponding electrical wire 40.

The leads 96 and 98 of the varistor 86 are held by the holder 82 (FIG. 3), the leads 102 and 104 of the varistor 88 are held by the holder 84, and the gas tube 92 is held by the holder 90. The support member 114 is engaged in physical contact with the varistor 88 to support the varistor 88 within the internal compartment 20 of the housing 18.

The end 124 of the lead 96 of the varistor 86 is electrically connected to the electrical wire 40*c* and the wire receptacle 50*c*. In the illustrated embodiment, the end 124 is wrapped around the wire terminal 52*c* of the electrical wire 40*c* to electrically connect the lead 96 to the electrical wire 40*c*. But, the end 124 of the lead 96 may be electrically connected to the wire terminal 52*c* using any other connection arrangement, structure, and/or the like. The lead 96 is electrically connected to the contact 66*c* of the wire receptacle 50*c* via the electrical connection between the wire terminal 52*c* and the contact 66*c*. Optionally, the end 124 of the lead 96 is soldered to the wire terminal 52*c* (regardless of the connection arrangement, structure, and/or the like used to electrically connect the lead 96 to the wire terminal 52*c*).

The end 126 of the lead 98 of the varistor 86 is electrically connected to the lead 128 of the gas tube 92. In the illustrated embodiment, the end 126 is wrapped around an end of the lead 128 of the gas tube 92 to electrically connect the lead 98 to the lead 128. But, the end 126 of the lead 98 may be electrically connected to the lead 128 of the gas tube 92 using any other connection arrangement, structure, and/or the like. Optionally, the end 126 of the lead 98 is soldered to the end of the lead 128 of the gas tube 92 (regardless of the connection arrangement, structure, and/or the like used to electrically connect the lead 98 to the lead 128). The resistor 130 is electrically connected between the leads 96 and 98. The resistor 130 may be electrically connected to the leads 96 and 98 using any connection arrangement, structure, and/or the like. Optionally, the resistor 130 is soldered to the lead 96 and/or 98 (regardless of the connection arrangement, structure, and/or the like used to electrically connect the resistor 130 to the leads 96 and 98).

The end 126 of the lead 98 is also electrically connected to the resistor 132, which includes the lead 134. The end 126 of the lead 98 may be electrically connected to the resistor 132 using any connection arrangement, structure, and/or the like. Optionally, the end 126 of the lead 98 is soldered to the resistor 132 (regardless of the connection arrangement, structure, and/or the like used to electrically connect the end 126 of the lead 98 to the resistor 132).

The lead 134 of the resistor 132 is electrically connected to the end 42*b* of the electrical wire 40*b*. In the illustrated embodiment, the lead 134 is engaged in physical contact with an electrical conductor 158 of the electrical wire 40*b* to electrically connect the lead 134 and the electrical wire 40*b*. Alternatively, the lead 134 is engaged in physical contact with a wire terminal (not shown) that terminates the end 42*b* of the electrical wire 40*b*. Optionally, the lead 134 is soldered to the electrical conductor 158 or a wire terminal that terminates the end 42*b* of the electrical wire 40*b*.

The lead 134 of the resistor 132 is also electrically connected to the lead 136 of the electrical wire 40*d*. The lead 134 may be electrically connected to the lead 136 using any connection arrangement, structure, and/or the like. Optionally, the lead 134 is soldered to the lead 136 (regardless of the connection arrangement, structure, and/or the like used to electrically connect the lead 134 to the lead 136).

The resistor 144 is electrically connected between the lead 134 of the resistor 132 and the end 140 of the lead 104 of the varistor 88. The resistor 144 may be electrically connected to the leads 134 and 104 using any connection arrangement, structure, and/or the like. Optionally, the resistor 144 is soldered to the lead 134 and/or 104 (regardless of the connection arrangement, structure, and/or the like used to electrically connect the resistor 144 to the leads 134 and 104.

The end 140 of the lead 104 of the varistor 88 is electrically connected to the resistor 142. The end 140 may be electrically connected to the resistor 142 using any connection arrangement, structure, and/or the like. Optionally, the end 140 of the lead 104 is soldered to the resistor 142 (regardless of the connection arrangement, structure, and/or the like used to electrically connect the end 140 of the lead 104 to the resistor 142).

The end 138 of the lead 102 of the varistor 88 is electrically connected to the wire receptacle 50*d*. In the illustrated embodiment, the end 138 is wrapped around the contact 66*d* to electrically connect the lead 102 to the contact 66*d* of the wire receptacle 50*d*. But, the end 138 of the lead 102 may be electrically connected to the contact 66*d* of the wire receptacle 50*d* using any other connection arrangement, structure, and/or the like. Optionally, the end 138 of the lead 102 is soldered to the contact 66*d* (regardless of the connection arrangement, structure, and/or the like used to electrically connect the lead 102 to the contact 66*d*).

The internal compartment 20 of the housing 18 is optionally filled with a potting and/or other electrically insulative material (not shown) that encapsulates some or all of the various circuit elements of the electrical circuit 16. The potting and/or other electrically insulative material may facilitate preventing electrical shorts within the electrical circuit 16 and/or may facilitate protecting the various circuit elements of the electrical circuit 16 from damage (e.g., from moisture, dirt, debris, other contaminants, impact, and/or the like).

Figure 8:
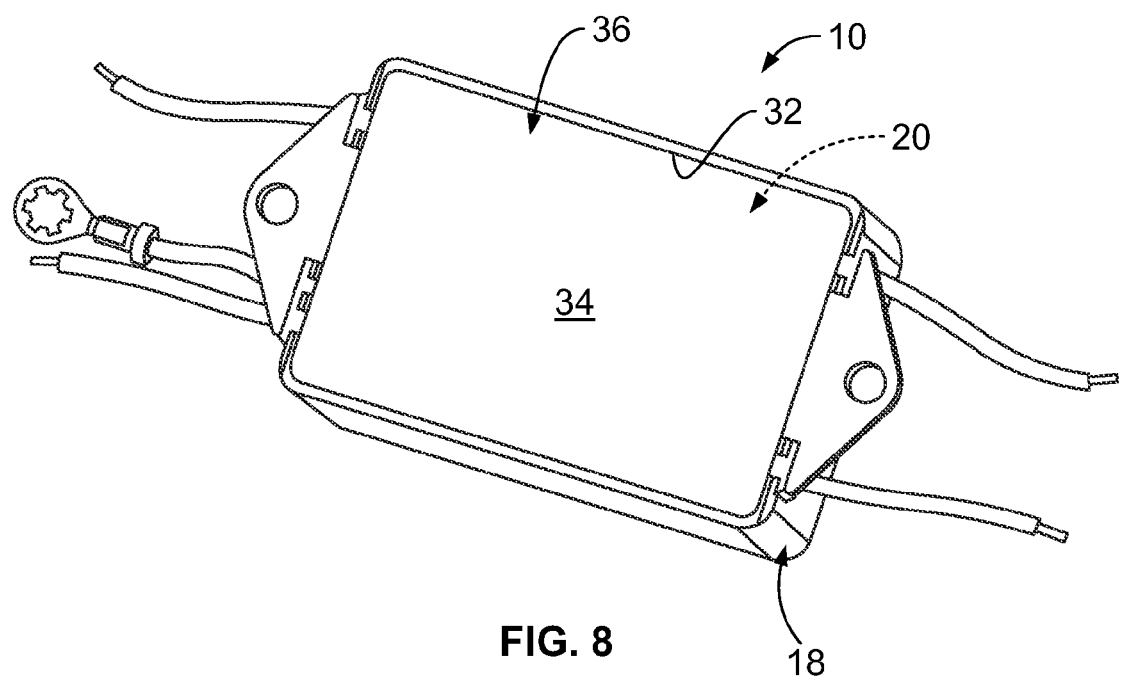
FIG. 8 is another perspective view of the circuit box shown in FIGS. 1-5 and 7.

FIG. 8 is another perspective view of the circuit box 10 illustrating an embodiment of the cover 34. The cover 34 is shown in FIG. 8 as mounted over the access opening 32 of the internal compartment 20 to at least partially close the access opening 32. The cover 34 therefore closes the internal compartment 20 of the housing 18. The cover 34 may be mounted over the access opening 32 using any suitable connection arrangement, structure, and/or the like, such as, but not limited to, using an interference-fit, using a snap-fit, using ultrasonic welding, using adhesive, using one or more threaded fasteners, using one or more non-threaded fasteners, using a latch, using a clip, using a clamp, and/or the like. Optionally, the cover 34 is removably mounted over the access opening 32.

Figure 9:
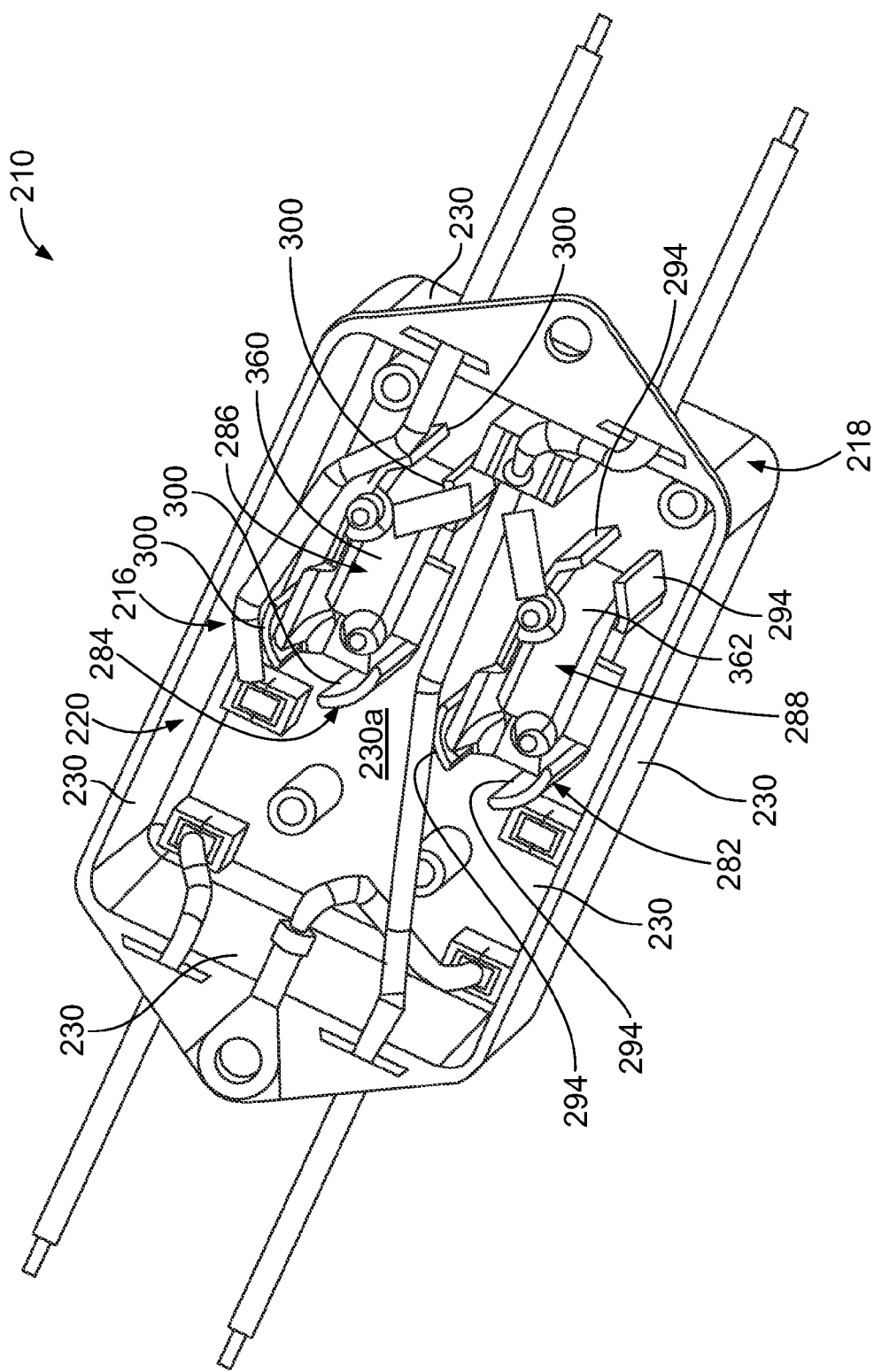
FIG. 9 is a perspective view of a portion of another embodiment of a circuit box.

FIG. 9 is a perspective view of a portion of another embodiment of a circuit box 210. The circuit box 210 includes a dielectric housing 218 that holds the various circuit elements of the electrical circuit 216 of the circuit box 210. Specifically, the housing 218 includes an internal compartment 220 within which the various circuit elements of the electrical circuit 216 are contained. In the illustrated embodiment, the electrical circuit 216 includes two varistors 286 and 288.

The housing 218 includes holders 282 and 284 that engage in physical contact with the varistors 286 and 288, respectively, to hold the respective varistor 286 and 288 within the internal compartment 220. The holder 282 includes four sub-holders 294 that engage in physical contact with a body 360 of the varistor 286 to hold the varistor 286 within the internal compartment 220 of the housing 218. In the illustrated embodiment, the sub-holders 294 of the holder 282 locate the body 360 within the internal compartment with a relatively loose fit. But, each of the sub-holders 294 may engage in physical contact with the body 360 of the varistor 286 using any other type of connection, such as, but not limited to, a snap-fit connection, an interference-fit connection, using a fastener, using an adhesive, using a latch, and/or the like. Although four are shown, the holder 282 may include any number of the sub-holders 294.

Optionally, the holder 282 is integrally formed as a single, unitary body with one or more walls 230 of the housing 18. For example, one or more of the sub-holders 294 may be integrally formed as a single, unitary body with one or more walls 230 of the housing 218 (whether or not the sub-holders 294 are integrally formed as a single, unitary body with the same wall 230). In the illustrated embodiment, the sub-holders 294 are each integrally formed with a wall 230a of the housing 218 as a single, unitary body. The holder 282 may be fabricated from the same dielectric material(s) as the housing 218, or may be fabricated from one or more different dielectric materials than the housing 218 (whether or not the holder 282 and housing 218 include any common dielectric material(s).

The holder 284 includes four sub-holders 300 that locate a body 362 of the varistor 288 to hold the varistor 288 within the internal compartment 220 of the housing 218. In the illustrated embodiment, the sub-holders 300 of the holder 284 engage in physical contact with the body 362 with a relatively loose fit. But, each of the sub-holders 300 may engage in physical contact with the body 362 of the varistor 286 using any other type of connection, such as, but not limited to, a snap-fit connection, an interference-fit connection, using a fastener, using an adhesive, using a latch, and/or the like. Although four are shown, the holder 284 may include any number of the sub-holders 300.

Optionally, the holder 284 is integrally formed as a single, unitary body with one or more walls 230 of the housing 18. For example, one or more of the sub-holders 300 may be integrally formed as a single, unitary body with one or more walls 230 of the housing 218 (whether or not the sub-holders 300 are integrally formed as a single, unitary body with the same wall 230). In the illustrated embodiment, the sub-holders 300 are each integrally formed with a wall 230a of the housing 218 as a single, unitary body. The holder 284 may be fabricated from the same dielectric material(s) as the housing 218, or may be fabricated from one or more different dielectric materials than the housing 218 (whether or not the holder 284 and housing 218 include any common dielectric material(s).

The embodiments described and/or illustrated herein may provide an electrical circuit between two electrical devices, wherein the electrical circuit is not implemented on a printed circuit board (PCB). For example, the circuit boxes shown and described herein do not include a PCB that is held within the internal compartment of the housing of the circuit box. The embodiments described and/or illustrated herein may provide a circuit box that provides strain relief to electrical wires that electrically connect the electrical circuit to the electrical devices.

The embodiments described and/or illustrated herein may provide an electrical circuit between two electrical devices that has a greater current carrying capability than at least some known electrical circuits between two electrical devices. The embodiments described and/or illustrated herein may provide an electrical circuit between two electrical devices that provides greater electrical isolation between the various circuit elements of the electrical circuit and/or between the electrical circuit and neighboring electrical devices as compared to at least some known electrical circuits between two electrical devices. The embodiments described and/or illustrated herein may provide an electrical circuit between two electrical devices that has more consistent electrical connections as compared to at least some known electrical circuits between two electrical devices.

The embodiments described and/or illustrated herein may provide an electrical circuit between two electrical devices that is less susceptible to damage (for example from moisture, dirt, debris, other contaminants, impact, and/or the like) as compared to at least some known electrical circuits between two electrical devices. The embodiments described and/or illustrated herein may provide an electrical circuit between two electrical devices that has features that stabilize the various circuit elements of the electrical circuit. The embodiments described and/or illustrated herein may provide an electrical circuit between two electrical devices that has a reduced number and/or resistance of electrical connections as compared to at least some known electrical circuits between two electrical devices. The embodiments described and/or illustrated herein may provide an electrical circuit between two electrical devices that accepts standard electrical wires, standard electrical contacts, and/or standard electrical leads. The embodiments described and/or illustrated herein may provide an electrical circuit between two electrical devices that accepts insulation and insulating sleeves for electrical isolation.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. A circuit box comprising:
a housing having an internal compartment, the housing comprising first and second entrances for receiving first and second electrical wires, respectively, into the internal compartment, the housing comprising first and second wire receptacles that include first and second dielectric shells, respectively, and first and second contacts, respectively, that are held by the first and second dielectric shells, respectively, the first and second contacts being electrically connected together, the first and second dielectric shells include first and second cavities that comprise pluggable interfaces that are configured to mechanically receive first and second wire terminals, respectively, that terminate the first and second electrical wires, respectively, such that the first and second contacts mechanically mate with the first and second wire terminals, respectively; and
a circuit element held within the internal compartment of the housing, wherein the circuit element is electrically connected to the first and second electrical wires.

2. The circuit box of claim 1, wherein the first and second contacts of the first and second wire receptacles, respectively, of the housing are electrically connected together via another electrical wire.

3. The circuit box of claim 1, wherein the first and second contacts of the first and second wire receptacles, respectively, of the housing are electrically connected together via another electrical wire that comprises a fuse between the first and second wire receptacles.

4. The circuit box of claim 1, wherein the housing comprises a holder that engages in physical contact with the circuit element with a snap-fit connection to hold the circuit element within the internal compartment of the housing.

5. The circuit box of claim 1, wherein the housing comprises a holder that locates the circuit element within the internal compartment of the housing, the holder being integrally formed as a single, unitary body with a wall of the housing.

6. The circuit box of claim 1, wherein at least one of the first wire terminal or the second wire terminal comprises an insulation displacement (ID) type contact.

7. The circuit box of claim 1, wherein at least one of the first dielectric shell or the second dielectric shell is integrally formed as a single, unitary body with a wall of the housing.

8. The circuit box of claim 1, wherein the housing comprises a strain relief feature that is configured to provide strain relief to the first electrical wire or the second electrical wire.

9. The circuit box of claim 1, further comprising at least one of the first electrical wire or the second electrical wire, wherein at least one of the first wire terminal or the second wire terminal comprises a strain relief feature that is configured to provide strain relief to the respective first or second electrical wire.

10. The circuit box of claim 1, wherein the housing comprises an access opening that enables access to the internal compartment, the housing further comprising a cover that is configured to be mounted over the access opening to close the access opening, the cover comprising an integral strain relief feature.

11. The circuit box of claim 1, further comprising a gas tube, wherein the housing comprises a holder that engages in physical contact with the gas tube to hold the gas tube within the internal compartment of the housing.

12. The circuit box of claim 1, wherein at least one of the first contact or the second contact is configured to be mechanically mated with the respective first or second wire terminal such that the at least one of the first contact or the second contact is electrically connected to the respective first or second wire terminal without using solder.

13. The circuit box of claim 1, wherein the circuit box does not include a printed circuit board that is held within the internal compartment of the housing.

14. The circuit box of claim 1, wherein the first and second contacts of the first and second wire receptacles, respectively, of the housing are electrically connected together via an electrical conductor of another electrical wire, and wherein a first segment of the electrical conductor comprises the first contact and a second segment of the electrical conductor comprises the second contact.

15. A circuit box comprising:
a housing having an internal compartment, the housing comprising first and second entrances for receiving first and second electrical wires, respectively, into the internal compartment, the housing comprising first and second wire receptacles that include first and second dielectric shells, respectively, and first and second contacts, respectively, that are held by the first and second dielectric shells, respectively, the first and second contacts being electrically connected together, the first and second dielectric shells include first and second cavities that comprise pluggable interfaces that are configured to mechanically receive first and second wire terminals, respectively, that terminate the first and second electrical wires, respectively, such that the first and second contacts mechanically mate with the first and second wire terminals, respectively, wherein the housing comprises a holder; and
a circuit element held within the internal compartment of the housing, the circuit element being electrically connected to the first and second electrical wires, wherein the holder of the housing is engaged in physical contact with the circuit element to hold the circuit element within the internal compartment of the housing.

16. The circuit box of claim 15, wherein the holder engages in physical contact with the circuit element with a snap-fit connection to hold the circuit element within the internal compartment of the housing.

17. The circuit box of claim 15, wherein the holder is integrally formed as a single, unitary body with a wall of the housing.

18. The circuit box of claim 15, wherein the holder is a first holder, the circuit box further comprising a gas tube, wherein the housing comprises a second holder that engages in physical contact with the gas tube to hold the gas tube within the internal compartment of the housing.

19. A circuit box comprising:
a housing having an internal compartment, the housing comprising first and second entrances for receiving first and second electrical wires, respectively, into the internal compartment, the housing comprising first and second wire receptacles that include first and second dielectric shells, respectively, and first and second contacts, respectively, that are held by the first and second dielectric shells, respectively, the first and second dielectric shells include first and second cavities that comprise pluggable interfaces that are configured to mechanically receive first and second wire terminals, respectively, that terminate the first and second electrical wires, respectively, such that the first and second contacts mechanically mate with the first and second wire terminals, respectively a third electrical wire held within the internal compartment of the housing, the third electrical wire electrically connecting the first wire receptacle to the second wire receptacle, wherein the third electrical wire comprises a fuse between the first and second wire receptacles.

20. The circuit box of claim 19, wherein a first segment of an electrical conductor of the internal electrical wire comprises the first contact and a second segment of the electrical conductor comprises the second contact.

* * * * *